United States Patent [19]

Neuner et al.

[11] 4,194,183

[45] Mar. 18, 1980

[54] APPARATUS FOR ELECTRICALLY CONVERTING AN ANALOG SIGNAL INTO A DIGITAL REPRESENTATION

[75] Inventors: James A. Neuner, Gibsonia; Charles W. Einolf, Jr.; Andras I. Szabo, both of Export, all of Pa.

[73] Assignee: Westinghouse Electric Corp., Pittsburgh, Pa.

[21] Appl. No.: 522,190

[22] Filed: Nov. 8, 1974

[51] Int. Cl.² ............................................. H03K 13/02
[52] U.S. Cl. .......................... 340/347 AD; 340/347 M; 340/347 NT; 364/574; 364/575
[58] Field of Search .................. 340/347 AD, 347 NT; 235/152; 364/574, 575

[56] References Cited

U.S. PATENT DOCUMENTS

| | | | |
|---|---|---|---|
| 3,484,591 | 12/1969 | Trimble | 235/152 |
| 3,879,724 | 4/1975 | McDonald | 340/347 AD |

OTHER PUBLICATIONS

Analog Devices, Inc., "Analog-Digital Conversion Handbook", 6/1972, Part I: pp. 87, 88, Part III: pp. 43, 44.
Berkeley et al., "Computers—Their Operation and Applications", Rheinhold Publishing Corp., 1956, pp. 27, 38.
Mitchell et al., "Data Averager for Panel Meter . . . ", Electronics, 4/1973 p. 103.
Analog Devices, Inc., "Analog-Digital Conversion Handbook", 6/1972 Part I: pp. 36–41, 46–53, 73–75, Part II: pp. 48–51, 138, 139 & Part III: pp. 70, 71, 80–85.

*Primary Examiner*—Thomas J. Sloyan
*Attorney, Agent, or Firm*—D. C. Abeles; Z. L. Dermer

[57] ABSTRACT

A method is described for electrically converting an analog signal into a digital representation in a manner that maximizes noise rejection. The digital representation is formed from a preselected number of discrete points corresponding to sampled approximations of the analog signal. In establishing the magnitudes of the respective points, digital samples of the analog signal are taken at a predetermined number of discrete coordinates along the analog signal on either side of the respective discrete points. The predetermined number of coordinates are averaged and employed as corresponding approximations for the respective discrete points in the digital representative reproduction of the analog signal. The effects of harmonics of power line frequencies associated with processing electrical equipment are minimized by sampling the discrete coordinates for a particular point over an integral number of cycles of the power line frequency. In addition, noise having a high frequency, low duty cycle can be minimized by sampling a relatively large number of discrete coordinates over a period substantially greater than the occurrence of the noise.

1 Claim, 10 Drawing Figures

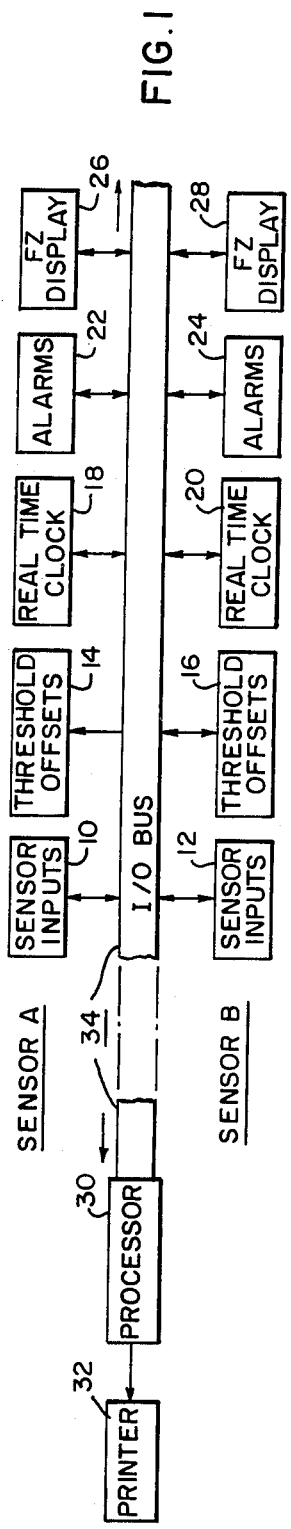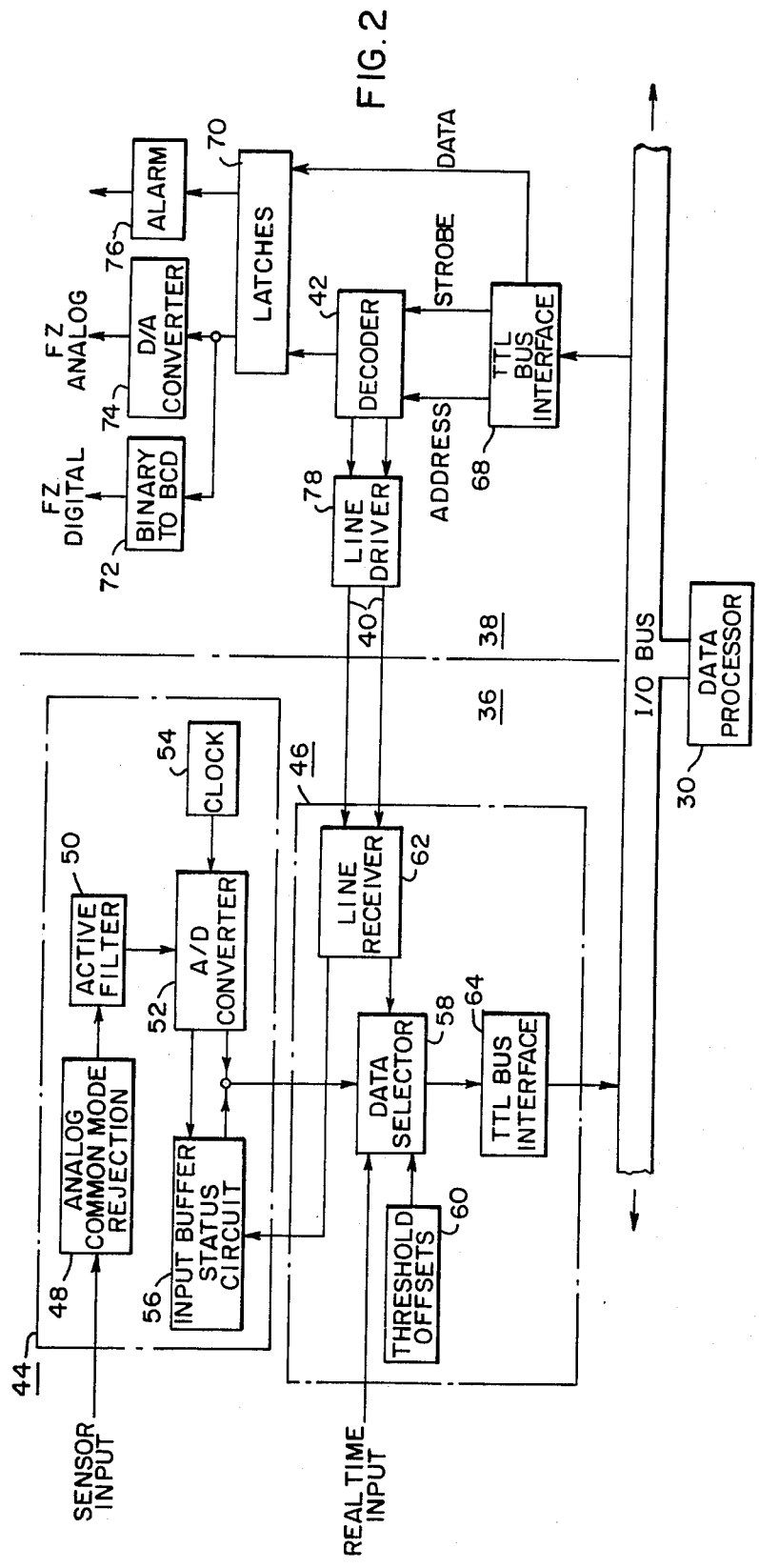

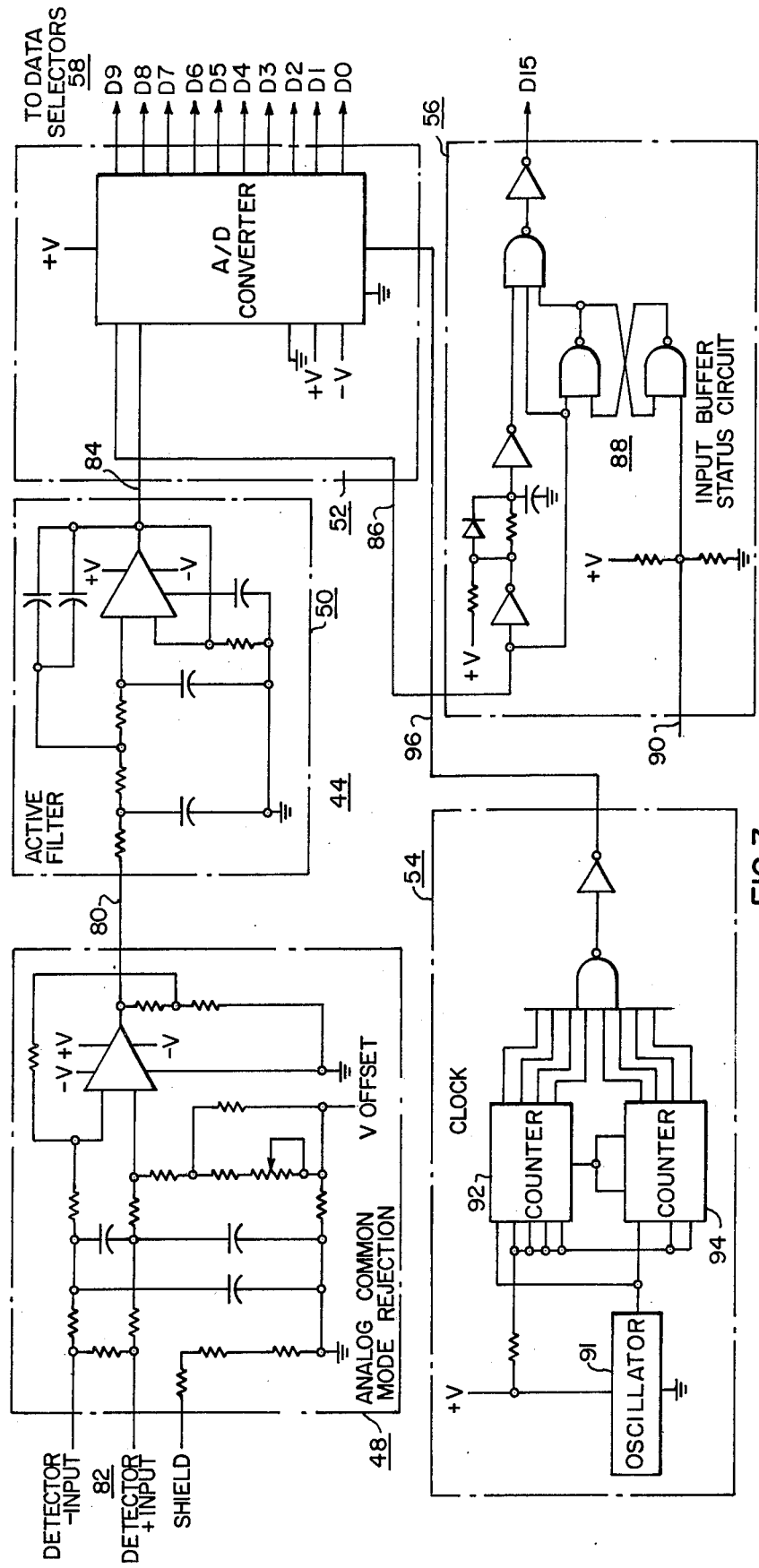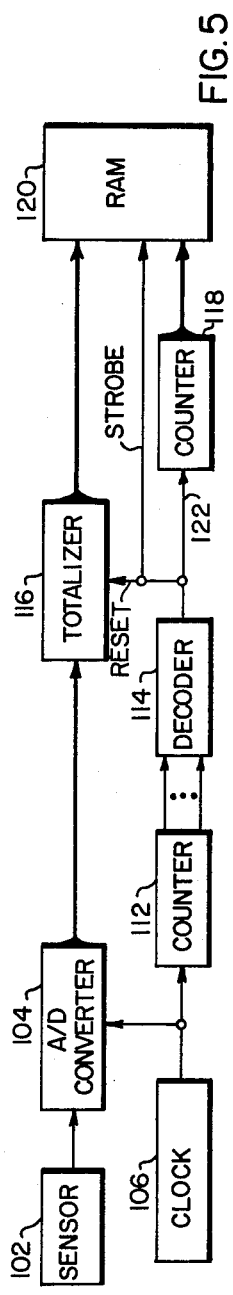

APPARATUS FOR ELECTRICALLY CONVERTING AN ANALOG SIGNAL INTO A DIGITAL REPRESENTATION

BACKGROUND OF THE INVENTION

This invention pertains generally to methods for converting analog signals into digital form and more particularly to analog to digital conversion methods that maximize noise rejection.

In many applications analog electrical signals are monitored as an indication of events occurring at remote locations. Frequently, it is necessary to transport the analog signals through adverse environments which contribute noise to the signal being conveyed. Often the noise contributions will obscure the information being communicated. While a number of noise rejection techniques are available in the form of filters, the slow response times exhibited are often objectionable. Noise problems become even more acute when further processing of the analog signals is required to obtain meaningful data. Arithmetic computations on the communicated information will in certain cases amplify the effective noise to signal ratio. In a number of applications, such computations are more efficiently obtained by first providing a digital representation of the analog input. However, in a high noise environment the digital samples will be severely affected by superimposed noise components.

Noise rejection problems as well as the problems associated with converting analog signals to digital form become even more acute in many industrial systems in which minicomputers are employed to interface with analog signals remotely generated. An example of such a system is the axial power distribution monitoring system employed as part of a number of pressurized water reactor surveillance systems. An example of such a system is described in application Ser. No. 379,159 entitled "A Method of Automatically Monitoring the Power Distribution of a Nuclear Reactor Employing Movable Incore Detectors", by James J. Loving, Jr. filed July 13, 1973 U.S. Pat. No. 3,932,211. The purpose of the system is to periodically scan the reactor core using movable incore flux mapping detectors. The neutron flux throughout the axial height of the core is recorded, normalized, and searched for unusual peaks that exceed acceptable limits. Unusual peaks in axial flux generally indicate abnormalities in the core such as gaps between fuel pellets caused by densification. The localized power increases that result must be kept within acceptable limits to insure the effectiveness of emergency core cooling systems in the unlikely event of severe accident conditions.

For maximum efficiency, it is necessary to compare normalized data, such as neutron flux divided by the average over the core height, to a variable threshold. Acceptable peaks are then determined as a funtion of axial position. Higher peaks can be tolerated in the bottom of the core than can be tolerated at the top of the core. The alarm threshold is therefore, monotonically decreasing with increasing height in the core. To perform this function properly, the raw data must be sampled and stored throughout a scan since the true average can only be calculated at the end of each scan. A normalized curve must be generated and compared to a variable alarm threshold. An analog implementation of this function would be highly expensive and complex compared to a digital approach with a large number of samples. To accomplish this result it is desirable to employ a bus oriented minicomputer system. However, data conversion and transfer is complicated by the severe electrical environment experienced under the ambient conditions associated with nuclear reactor facilities.

The axial power distribution monitoring system, like many other systems that employ digital minicomputers, requires that all inputs and outputs be interfaced by input/output circuitry located outside the computer. In addition, the analog signals must be converted to a digital representation by the input/output circuitry before being communicated to the computer. While the internals of the minicomputer are free of electromagnetic interference due to appropriate shielding and filtering techniques, the input/output electronics experience a more severe environment since the remainder of the system employs very little shielding of filtering. Inexpensive successive approximation analog to digital converters used generally on input/output cards are particularly sensitive to interference on the incoming analog signals. Even when the analog signals are sufficiently processed to cleanse them of interference, and-/or dual slope analog to digital converters are employed, the logic and wiring from the converter to the computer remains susceptible to interference either from the power supply lines or radiation from other signal lines.

Accordingly, in the axial power distribution monitoring system, as in many systems, the need exists for a simple, inexpensive technique to accept low speed analog signals, and convert and transfer them within an electrically noisy environment to a separate minicomputer. This must be accomplished with a minimum susceptibility to electro-magnetic interference and without expensive shielding and filtering of the entire system.

SUMMARY OF THE INVENTION

Briefly, this invention overcomes the deficiencies of the prior art by providing a method for electrically converting an analog signal into a digital representation in a manner that maximizes noise rejection. In accordance with the method of this invention the analog signal is converted into digital approximations in the form of a preselected number of discrete points sufficient to provide a digital representative reproduction. The approximations are obtained from digital samples taken at a predetermined number of discrete coordinates along the analog signal on either side of the respective discrete point locations. The predetermined number of coordinates sampled on either side of each discrete point is averaged to obtain averaged values which are then employed as corresponding approximations for the respective discrete points. Desirably, the distance between discrete points is substantially greater than the period between the samples of discrete coordinates. Furthermore, to minimize the effects of harmonics of the power line frequency, the time period over which the discrete coordinates are sampled for a corresponding discrete point is chosen to substantially equal an integral number of cycles of the power line frequency. In addition, to minimize high frequency noise having a low duty cycle the time period over which the discrete coordinates are sampled for a corresponding discrete point is arranged to be substantially greater than the period of occurrence of high frequency noise.

BRIEF DESCRIPTION OF THE DRAWINGS

For a better understanding of the invention, reference may be had to the preferred embodiment, exemplary of the invention, shown in the accompanying drawings, in which:

FIG. 1 is a block diagram of an exemplary monitoring system employing the method of this invention;

FIG. 2 is a block diagram of the input/output electronics employed in practicing the method of this invention in the exemplary system of FIG. 1;

FIG. 3 is a schematic circuitry diagram of the analog/digital converter and conditioning interface illustrated in block form in FIG. 2;

FIG. 5 is a block diagram of individual hardware components which can be employed to practice the method of this invention.

DESCRIPTION OF THE PREFERRED EMBODIMENT

Figure 4:
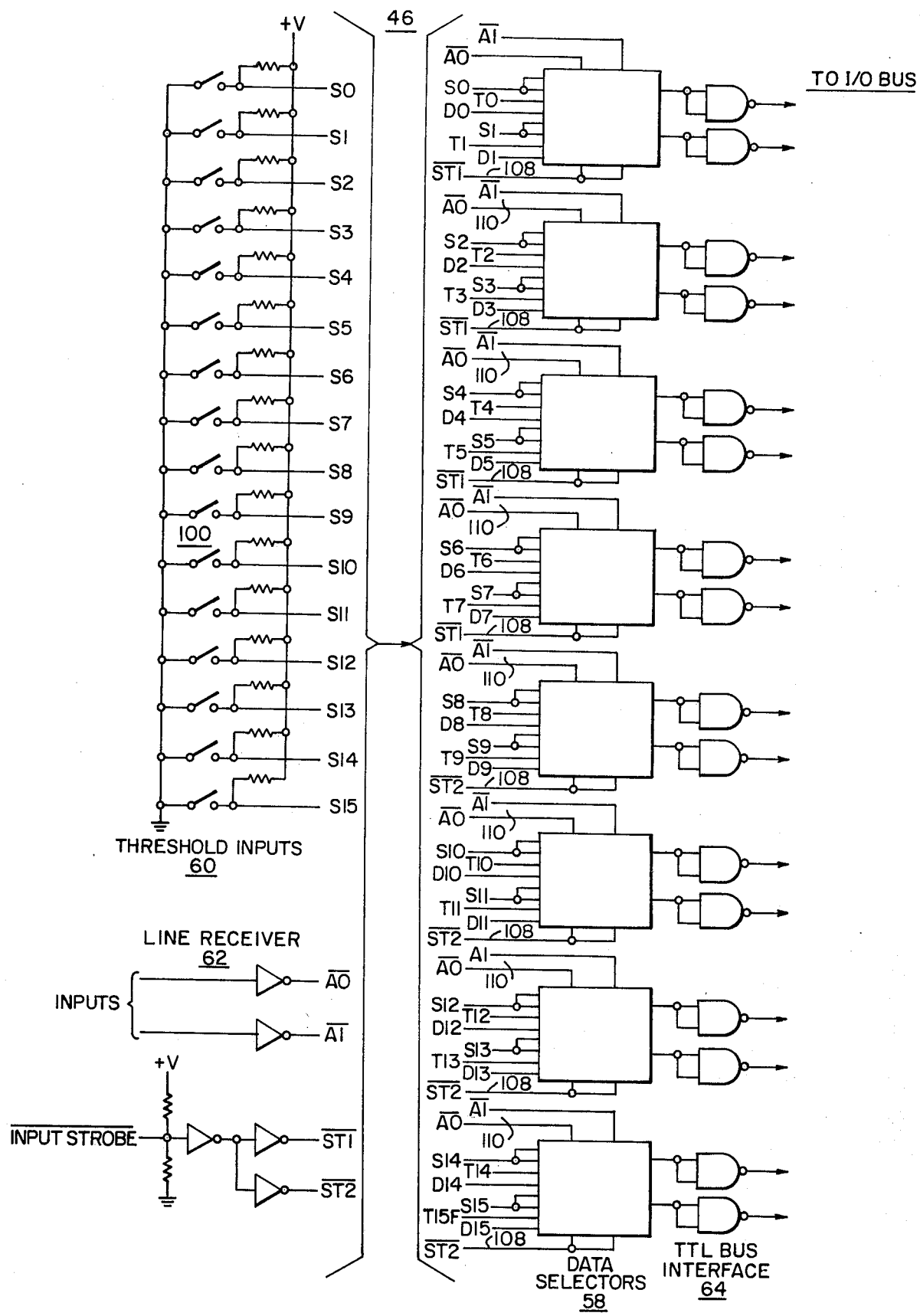
FIG. 4 is a circuitry schematic of a second portion of the block diagram illustrated in FIG. 2.

In order to better appreciate the preferred mode of practicing this invention, the individual steps will be described as applied to a reactor axial power distribution monitoring system such as the one described previously and illustrated in block form in FIG. 1. Generally, in this particular type of system, two detectors are employed to scan the reactor core. The detector outputs are communicated respectively to blocks 10 and 12. Alarm limits generally referred to as threshold offsets are selected prior to the operation of the system and are entered into the system through blocks 14 and 16. Real time clocks 18 and 20 supply an indication of the time of each scan. Processed outputs of the two detectors are respectively communicated through blocks 22, 24, 26 and 28. Modules 10, 14, 18, 22 and 26 process the information generated by one of the two scanning detectors, identified as sensor A and modules 12, 16, 20, 24 and 28 process the signals presented by the second scanning detector, sensor B. Each of the individual modules are in communication with a common input/output bus 34, which transports data to and from a central processing unit 30, which can be any one of a number of special purpose computers such as the Data General 1220 minicomputer, manufactured by the Data General Corporation of Southboro, Massachusetts. The processor communicates with the individual modules through a preselected arrangement of corresponding addresses, which are recognized by the respective modules being called upon to transmit or receive data. In addition, the processor 30 communicates with a printer 32 to supply a visual display of the desired data. The relationship of the various blocks illustrated in FIG. 1 to the steps of the method of this invention will be appreciated from the following explanation which sets forth in detail the pertinent portions of the system.

FIG. 2 provides a more detailed illustration of the various functions of the individual modules identified in FIG. 1 which are particularly pertinent to the steps of the method of this invention. The block diagram of FIG. 2 is separated into two distinct arrangements 36 and 38, which respectively show the input and output functions of the system. The input function is represented in FIG. 1 by modules 10, 12, 14, 16, 18 and 20, while the output function is the responsibility of modules 22, 24, 26 and 28. The input and output functions are not completely isolated in the Figure as shown, in that in order to reduce circuitry costs a common decoder 42 is employed to decipher the address lines for both the input and output functions. Communication between the two functions is established by the conductors 40, while isolation is maintained by the interfaces 62 and 78. The circuitry for the input arrangements 44 and 46 is shown in even greater detail in FIGS. 3 and 4 as will be appreciated from the corresponding description set forth hereinafter.

In applying the method of this invention to this particular application normal noise rejection methods are used to accept the analog signals at the sensor inputs to the input card 36. Common mode rejection is first implemented, as represented by block 48, to remove noise induced by different ground potentials. Next, an active filter 50 is used to maximize the signal to noise ratio. A standard inexpensive medium speed analog to digital converter 52 processes a corresponding digital output at intervals triggered by the clock 54. As previously explained, new conversions are initiated on a periodic basis by the free running clock 54 at a much higher rate than would otherwise normally be required to generate a digital reproduction. Each conversion is read into the minicomputer 30 when the input buffer status circuit 56 identifies that a new sample is ready to be transferred. The data selector 58 is responsive to an appropriate address from the computer to transmit the sample to the input/output (I/O) bus. The transistor to transistor logic bus interface 64 functions as a buffer between the input/output bus and the data selector. The threshold offsets, which determine alarm limits, are initially programmed through the data selector directly into the data processor 30 by appropriate address commands. After a fixed large number of samples are transferred to the minicomputer an average is computed to determine a single discrete data point.

Most electromagnetic interference which may affect the ditial data enroute from the analog to digital converter on the input card, to the minicomputer will be of a high frequency, low duty cycle nature. In other words, the ratio of occurrence of high frequency noise is small compared to the period of nonoccurrence. Therefore, the high frequency, low duty noise will affect only a small number of samples used to compute each data point. The effect after averaging in accordance with this invention will be minimal.

In order to minimize the effects of harmonics of power line frequencies, the averaging period is desirably chosen to be an integer number of cycles of the power line frequency. For this particular application the period is preferably chosen to be 100 milliseconds so that it is representative of an integer number of cycles for either 50 or 60 Hz. If the sampling period is an integral multiple of the interference period, infinite noise rejection occurs. For periods not exact multiples, two extreme cases can be calculated to show the effects. The first case occurs when the averaging period begins at the zero crossing of the interference frequency, normally referred to as a phase-locked condition. The average value for a sample with period T can be represented by the equation:

$$\text{Average (phase-locked)} = \frac{1}{T} \int_0^T V \sin \omega t \, dt$$
$$= \frac{(1 - \cos \omega T)}{\omega T} V;$$

where $\omega$ is the angular frequency and $V$ is the magnitude of the interference. Accordingly, $$\text{Attenuation (phase-locked)} = 20 \log_{10} (\text{Average}/V)$$
$$= 20 \log_{10} \omega T - 20 \log_{10} (1 - \cos \omega T).$$

Similarly, a second case can be calculated when the averaging period begins at a peak of the interference (noted as the worst-case). The average value can be represented by the equation $$\text{Average (worst-case)} = \frac{1}{T} \int_0^T V \cos \omega t \, dt$$
$$= \frac{V}{\omega T} \sin \omega T.$$

Thus, $$\text{Attenuation (worst-case)} = 20 \log_{10} \omega T - 20 \log_{10} (\sin \omega T)$$

From the above it can be appreciated that at frequencies near the 50/60 Hz power line frequencies and their harmonics the attenuation approaches infinity and will be limited only by the finite number of samples taken. Finally, the number of samples to be taken during the 100 millisecond averaging period in this particular example is desirably chosen to be an integer power of two, i.e. $2^9$ which equals 512, so that the division required to compute the average is reduced to a simple and fast shifting procedure within the computer.

The output side of FIG. 2 illustrates how the processed information in distributed. The decoder 42 interprets the addresses provided by the data processor 30 and conveys the corresponding information to appropriate R-S flip-flops within latches 70, which store the data to provide a continuous output to the appropriate output devices. The binary to binary coded decimal converter 72 displays the highest $F_Z$ output sampled in digital form. The digital to analog converter 74 provides the same output in analog form. The alarm circuitry 76 identifies when the threshold offsets have been exceeded and alerts the plant operator. The line receiver 62 and line driver 78 function to interface the input section 36 with the output section 38.

Thus, it can be generally appreciated that the input data is sampled at a relatively rapid rate and a given number of samples averaged to establish a fixed discrete data point, which is then stored in the data processor. When a given number of discrete points have been stored in the data processor 30 a digital representation of the input analog signal is formed. The averaging employed to establish each discrete point substantially enhances noise rejection efforts.

The circuit 48 illustrated in FIG. 3 will readily be recognized by those skilled in the art as a simple analog common mode noise rejection arrangement which receives the detector input at terminal 82 and provides a common ground output 80 to the active filter 50. Similarly, the circuit arrangement 50 filters the incoming signal to remove additional noise and communicates the filtered output 84 to the analog to digital converter 52.

The converter processes the signal into a corresponding digital representation, D0 through D9, and generates a separate output 86 to the buffer status circuit 56, identifying that the digital outputs have been established. The main component of the buffer status circuit is an RS flip-flop 88, which is set by the output 86. The set signal is communicated to the computer by bit D15 to trigger the computer to read in the sampled processed data. The sampling rate is controlled by a free running clock 54 having an oscillator 91 which drives two four-bit counters 92 and 94. The clock output 96 triggers the converter to provide the sampling period desired.

Accordingly, each time the clock 54 triggers the analog to digital converter an appropriate digital output is established and the buffer status circuit 56 is set to identify that the information is in proper form for transmission. The computer is responsive to the buffer status circuit output D15 to accept and store the data and reset the buffer status circuit through an appropriate address and command communicated through the decoder 42 to terminal 90. As will be appreciated from the operational explanation of the computer to follow, the computer will store 512 digital points corresponding to the analog samples taken before the averaging process is performed and the resulting averaged discrete point stored in the computer's random access memory. Throughout the computational process additional data is continually being accepted from the analog to digital converter to establish the next averaged discrete point after 512 samples have been collected.

FIG. 4 is a circuit schematic of the functions previously identified by reference character 46 in FIG. 2. The threshold offsets are programmed in binary by the plant operator by opening and closing the appropriate switches 100. The threshold offsets are then communicated by the data words $S_0$ through $S_{15}$ when properly addressed by the computer. The data selector unit 58, which is an appropriate arrangement of logic gates, receives inputs from the $S_n$ lines, representative of the threshold offsets; the $T_n$ lines, representative of the real time in hours and minutes; and the $D_n$ data outputs. Upon receiving a designated decoded address 110 from the decoder 42 the corresponding outputs are strobed by the inputs 108 to the input/output bus communicating with the data processor 30. The transistor to transistor logic interface 64 properly conditions the outputs for transmission to the bus.

Up to this point the steps of the method of this invention have been described as being implemented by hardware in combination with the programmed processing operations of a minicomputer. However, it should be appreciated that though a minicomputer does serve as a preferred mode for practicing the invention, hardware without the aid of software can be used to accomplish the same steps, as illustrated in FIG. 5.

In accordance with the arrangement illustrated in FIG. 5 the sensor inputs, represented by block 102, are first filtered by circuits similar to those previously identified by reference characters 48 and 50 in FIGS. 2 and 3. The filtered outputs are processed by an analog to digital converter 104 similar to that illustrated previously by reference character 52. An oscillator or clock 106 such as the one illustrated in FIGS. 2 and 3 by reference character 54 triggers the analog to digital converter 104 to provide the desired frequency of digital samples to a summing unit or totalizer 116. The oscillator 106 also drives a counter 112, which is monitored by a decoder unit 114. A given arrangement of output bits of the counter 112 is identified by the decoder output 122. The output 122 serves several functions. It is used to clock an additional counter 118, as well as reset the totalizer 116 and strobe the random access memory 120 to accept the outputs from the totalizer 116.

Thus, the analog signal is continuously sampled by the analog to digital converter 104 according to the frequency prescribed by the clock 106. The digital samples are continuously fed to the totalizer 116, which maintains a running sum of the incoming data until reset.

Accordingly, it can be appreciated from the processor example set forth previously that the decoder 114 is arranged to recognize when the counter 112 has sequenced 512 states and strobe the random access memory to accept the totalizer output representative of the 512 points. As the information is being conveyed from the totalizer to the random access memory the decoder resets and readies the totalizer to accept a new set of 512 samples.

The counter 118 advances one count for each decoder output identifying the location within the random access memory that the output of the totalizer is to asume. Averaging occurs by dropping the least significant bits of totalizer output.

The averaging process is a common binary operation utilizing a binary shift to accomplish division. In this particular operation the most significant bits stored in the random access memory are equal in number to the total number of bits received from the analog to digital converter.

In this manner, the random access memory acquires a table of digital outputs which is essentially a digital representation of the input analog signal. The totalizer function in summing and averaging the given number of digital samples of each data point accomplishes the noise rejection steps contemplated by this invention.

As an alternative to the hardware arrangement provided in FIG. 5 the data processor 30 can be programmed to perform the computational and storage functions described. The pertinent program routines employed in carrying out the particular steps applicable to the axial power distribution monitoring system of this embodiment are illustrated in the flow charts provided in FIGS. 6 throuh 10 and the program statements set forth in the appendix.

As previously stated for this particular application, and for the other similar applications concerned with normal power line frequency noise and high frequency, low duty cycle noise, approximately 512 samples are desired for each discrete representation used in the digital reproduction of the analog signal. To establish a representative reproduction it is desirable to obtain an average discrete point approximately every tenth of a second. This amounts to approximately 600 discrete points for each detector scan. The operation of the processor can thus be understood from the following explanation of the programmed events.

Figure 6:
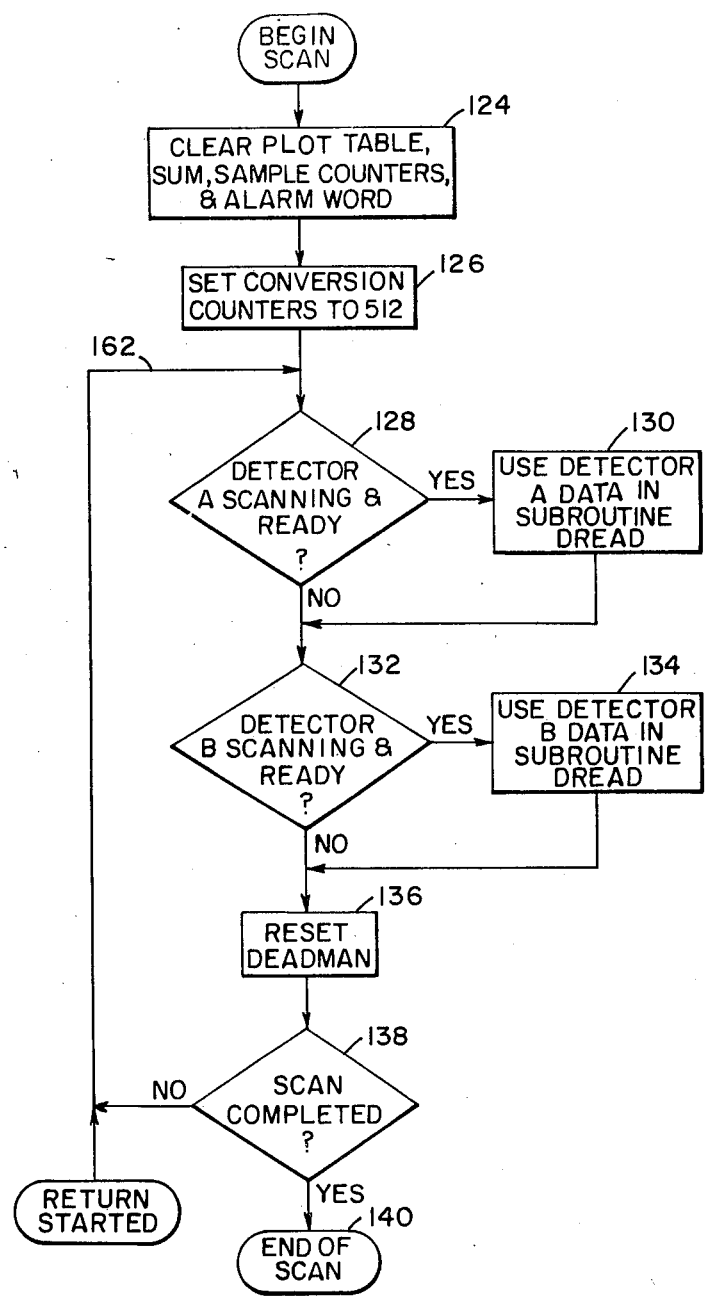
FIGS. 6, 7, 8, 9 and 10 illustrate flow diagrams corresponding to the various subroutines which can be employed to control the processor of FIG. 1 to perform the steps of the method of this invention.

FIG. 6 provides an overview of a program routine entitled "Begin Scan" which outlines the operations performed within the processor. Consistent with normal programming practices a rectangle is employed to indicate a processing operation except for a decision; a diamond identifies a decision, with the lines leaving the box labeled with the decision results; and an oval is used to indicate the beginning or ending point of a program. Arrows connect the flow chart designations to identify the sequence of events performed by the processor.

Thus, "Begin Scan" is the beginning of a program routine starting with the direction 124 which prescribes a bookkeeping operation that clears the plot table, sum, sample counters and alarm words, readying the computer to accept new data to be supplied in the course of a new scan. The bookkeeping operations are processed within the computer in accordance with octal statements 770 through 1003 set forth in the appendix. The octal arrangement is chosen to be compatible with the specific computer employed in this example. The sample counter referenced in the bookkeeping operation 124 keeps track of the 600 discrete points used in the digital reproduction.

The next processing operation 126 sets the conversion counters to 512, which identify when the proper number of samples have been taken before the samples are averaged to obtain each discrete point. This particular operation is sequenced by program statements 1004 through 1006.

The next processing operation described in program statements 1007 through 1017, questions whether detector A is scanning and ready. If the result is yes the program is directed to a new subroutine identified by the title "DREAD", set forth in program statements 1361 through 1403. The computer processes the data from detector A in accordance with the directions of the subroutine, to be described hereinafter, and then returns to the next decision 132. If detector A is not scanning and is not ready then the computer immediately proceeds to the next decision 132 which determines whether detector B is scanning and ready. If the result of the decision is yes then the computer uses the detector B data in subroutine "DREAD" and returns to the next processing operation.

The following processing operation 136, entitled "RESET DEADMAN", is a separate subroutine set forth in statements 1564–1570, which will be described hereinafter. Briefly, subroutine "DEADMAN" directs a specific coded sequence of outputs to a fault detection circuit described in detail in Patent Application Ser. No. 522,191 entitled "An Electrical Fault Indicator" by C. W. Einolf, Jr. et al, field Nov. 8, 1974. Upon completion of the instructions of the "DEADMAN" routine the computer implements another decision 138 to determine whether the detector scans are completed. If the decision is yes the routine terminates in an "END OF SCAN" routine 140, which directs a separate series of operations not pertinent to this invention. If the computer identifies that a scan is still in progress, the program returns to decision block 128 via loop 162 to continuously collect the data being generated by the detectors.

Figure 7:
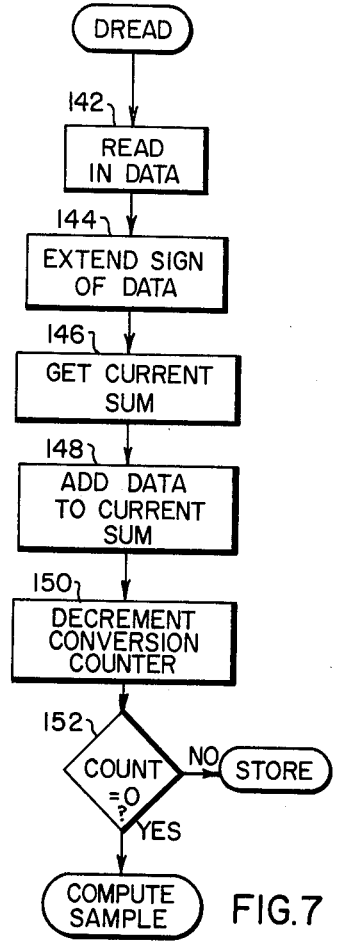

FIG. 7 outlines the steps of subroutine "DREAD". Initially the program gathers the samples obtained from the detectors as represented by the direction 142 "READ IN DATA" described in program statement 1007 for detector A and 1020 for detector B. The data is actually supplied to the computer during the course of a separate subroutine entitled "SCAN" set forth in statement 1337 through 1351, described hereinafter.

The next direction (144) after the data has been accessed by the computer is to "EXTEND SIGN OF DATA". The pertinent steps for carrying out this direction are set forth in statements 1361 through 1373 in the appendix. The effect of direction 144 is to process the input data into compatible form for the particular computer chosen for this operation.

Direction 146 next specifies that the computer get the current running sum in accordance with statements 1374 through 1402. The data inputted in this particular sample is then added to the current sum as directed by block 148, and the conversion counter is decremented as indicated by block 150 and instructed by statement 1403, reducing the 512 counter by one count indicating that one less data entry is required before the average is taken.

Figure 8:
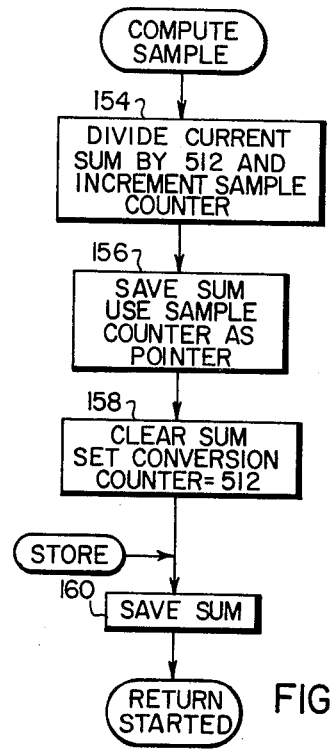

Decision 152 questions whether the conversion counter has been decremented to zero and if the result is yes the 512 samples are passed to the "COMPUTE SAMPLE" continuation of the "DREAD" subroutine which averages the running sum as outlined in FIG. 8. If the conversion counter has not reverse counted to the zero state then the current sum is stored.

Accordingly, every time a sample is taken in either of the two loops illustrated in FIG. 6 by reference characters 128 and 130, and 132 and 134, the "DREAD" subroutine is called upon to read the data, process it to a compatible form for the computer, get the current sum to data, add the data to the current sum and decrement the counter until 512 samples have been taken.

The "COMPUTE SAMPLE" portion of the "DREAD" subroutine called upon in the flow chart of FIG. 7 is outlined in FIG. 8. The first direction 154 requires that the computer divide the current sum by 512 and increment the sample counter one count in accordance with statements 1404 through 1416. The sample counter is used to identify each of the discrete 600 representations which will be used as a digital reproduction of the input analog signal. The next direction set forth in statements 1417 through 1423, entitled "SAVE SUM, USE SAMPLE COUNTER AS POINTER" in block 156 points to the corresponding location in the table in the random access memory where the discrete point averaged from the 512 samples is to be stored. The accumulated table of 600 stored points can then be used as the digital reproduction of the analog signal. The computer then clears the sum and sets the conversion counter to 512 in anticipation of the next entry in accordance with the directions provided by block 158 and statements 1427 through 1432. Next the computer is again instructed to save the sum by the flow chart direction 160. However at this point in the sequence of operation, the sum is zero so that computer returns to the loop 162, identified in FIG. 6, to await the next scan.

It should be appreciated that the "STORE" direction specified in the "DREAD" subroutine of FIG. 7 is also a direction to save the sum 160 and return to the loop 162. However, at this point in the course of operation of the program a sum has been established and is saved until new data is added by the "DREAD" routine. The "STORE" and "SAVE SUM" directions 160 are supplied by statements 1433 through 1435.

Figure 9:
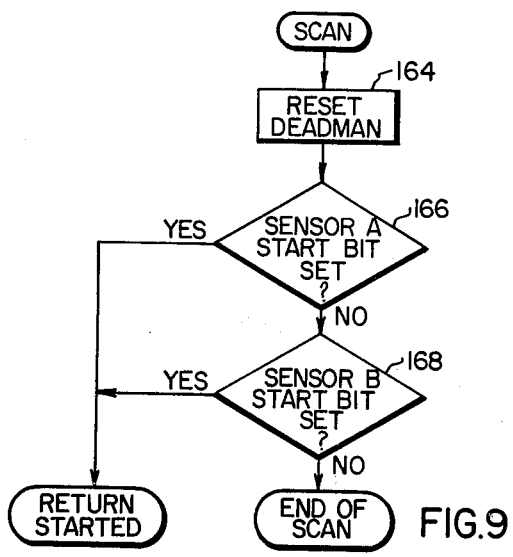
Figure 10:
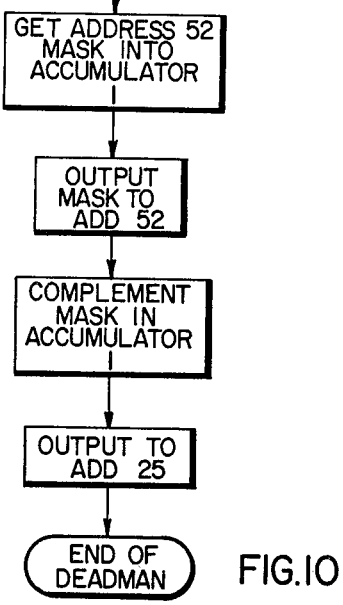

FIG. 9 outlines the "SCAN" subroutine called upon by blocks 136 and 138 in FIG. 6. Initially, "SCAN" routine calls upon the "DEADMAN" routine to output prescribed coded addresses and data words to the fault monitoring circuit described in application Ser. No. 522,161, entitled "An Electrical Fault Indicator", by C. W. Einolf, Jr. and J. A. Neuner, filed Nov. 8, 1974. The steps of the "DEADMAN" routine are outlined in FIG. 10 and specified in statements 1564 through 1570. Following the output of the "DEADMAN" code the computer decides whether sensor A has started or is in the middle of a scan and if the result is no, the computer then questions whether sensor B has started or is in the middle of a scan as indicated by the decision blocks 166 and 168 and the corresponding program statements 1337 through 1351. If the decision in both cases is no then the result of decision 138 requested in FIG. 6 will be yes and the computer will proceed to the direction indicated by block 140. If a scan has been indicated by either decision block, then the result of the "SCAN COMPLETED" decision 138 in FIG. 6 will be no and the computer will return via loop 162 to process the new data being generated by the detector.

Accordingly 600 discrete points are stored in a table for each scan with each point being determined by 512 averaged samples.

Thus, the method of this invention provides an inexpensive mechanism for converting analog signals to digital form in a manner that maximizes the signal to noise ratio without compromising the accuracy of the conversion.

| STATEMENT NO. IN OCTAL | MACHINE LANGUAGE | INPUT CARD | | | |
|---|---|---|---|---|---|
| | | | | ;DETECTOR SCAN ROUTINE | |
| | | | | ;CLEAR PLOT TABLES , SAMPLE CTRS..DBL PREC. SUM. | |
| | | | | ;ALARM WD. | |
| 00770 | 102440 | SCAN1: | SUB0 | 0,0 | ;CLEAR AC0 |
| 00771 | 030051 | | LDA | 2,PLOTA | ;GET FIRST LOC OF PLOT TABLE A |
| 00772 | 024071 | | LDA | 1,PSWNA | ;GET LAST LOC TO BE CLEARED |
| 00773 | 006202 | | JSR | @.CLR | ;CLEAR ALL LOC FROM AC2 TO AC1 |
| 00774 | 030074 | | LDA | 2,PLOTB | ;GET FIRST LOC OF PLOT TABLE B |
| 00775 | 024114 | | LDA | 1,PSWNB | ;GET LAST LOC TO BE CLEARED |
| 00776 | 006202 | | JSR | @.CLR | ;CLEAR ALL LOC FROM AC2 TO AC1 |
| 00777 | 100000 | | COM | 0,0 | ;SET AC0 = ALL 1'S |
| 01000 | 042055 | | STA | 0,@ALRMA | ;SET ALARM WORD A = ALL 1'S |
| 01001 | 042100 | | STA | 0,@ALRMB | ;SET ALARM WORD B = ALL 1'S |
| 01002 | 042061 | | STA | 0,@ALMPA | ;SET ALARM MAP SENSOR A = 177777 |
| 01003 | 042104 | | STA | 0,@ALMPB | ;SET ALARM MAP SENSOR B = 177777 |
| | | | | ;SET CONVERSION COUNTERS | |
| 01004 | 024177 | | LDA | 1,CONUI | ;GET # CONVERSIONS PER SAMPLE=512DECIMAL |
| 01005 | 046056 | | STA | 1,CONIAG | ;SET CONVERSION COUNTER A |
| 01006 | 046101 | | STA | 1,CONTB@ | ;SET CONVERSION COUNTER B |
| | | | | ;READ SENSOR A | |
| 01007 | 070474 | DETA: | DIA | 2,74 | ;GET DETECTOR A |
| 01010 | 024156 | | LDA | 1,MSKU2 | ;GET SCAN & STATUS BIT MASK |
| 01011 | 141000 | | MOV | 2,0 | ;SAVE DATA IN AC0 |
| 01012 | 133420 | | ANDZ | 1,2 | ;MASK DATA A |
| 01013 | 146454 | | SUB0 | 2,1,SZR # | ;ARE SCAN & STATUS BOTH = 1? |
| 01014 | 000404 | | JMP | DETB | ;NO-GO TO DETECTOR B |
| 01015 | 061074 | | DOA | 0,74 | ;YES-RESET STATUS BIT |
| 01016 | 006206 | | JSR | @.DRED | ;ADD CONVERSION TO SAMPLE |
| 01017 | 000052 | | NSAMA | | ;LOC OF LOC OF SAMPLE CTR-DEL A (BEGIN VAR LIST) |

| STATEMENT NO. IN OCTAL | MACHINE LANGUAGE | INPUT CARD | | | |
|---|---|---|---|---|---|
| | | | | | ;READ SENSOR B |
| 01020 | 070464 | DETB: | DIA | 2,64 | ;GET DETECTOR B |
| 01021 | 024156 | | LDA | 1,MSKU2 | ;GET SCAN & STATUS BIT MASK |
| 01022 | 141000 | | MOV | 2,0 | ;SAVE DATA IN ACU |
| 01023 | 133420 | | ANDZ | 1,2 | ;MASK DATA |
| 01024 | 146434 | | SUBZ | 2,1,SZR # | ;ARE SCAN & STATUS BOTH =1? |
| 01025 | 000404 | | JMP | .+4 | ;NO-CHECK IF SCAN CONTINUES |
| 01026 | 061064 | | DOA | 0,64 | ;YES-RESET THE STATUS BIT |
| 01027 | 006206 | | JSR | @DRED | ;JUMP TO DREAD |
| 01030 | 000075 | | NSAMB | | ;LOC OF LOC OF SAMPLE CTR-DET B (BEGIN VAR LIST) |
| 01031 | 006200 | | JSR | @SCAN | ;IS THE SCAN CONTINUING ? |
| 01032 | 000755 | | JMP | DETA | ;YES |
| 01033 | 000406 | | JMP | .+6 | ;JMP OVER UNUSED LOCATIONS |
| | 000005 | | .BLK | 5 | ;FIVE UNUSED LOC FOR QUICK FIX ;;;;;;;;;;;;;;;; |

;END OF SCAN ROUTINE

| STATEMENT NO. IN OCTAL | MACHINE LANGUAGE | INPUT CARD | | | |
|---|---|---|---|---|---|
| | | | | | ;SUBROUTINE SCAN - LEVEL 4 |
| 01337 | 056250 | SCAN: | STA | 3,@SAVE4 | ;SAVE THE RETURN ADDRESS |
| 01340 | 006207 | | JSR | @DEDM | ;RESET DEADMAN |
| 01341 | 024155 | | LDA | 1,MSKU1 | ;GET SCAN BIT MASK (BIT 13) |
| 01342 | 070474 | | DIA | 2,74 | ;GET DETECTOR A |
| 01343 | 133434 | | ANDZ | 1,2,SZR # | ;DETECTOR A SCANNING ? |
| 01344 | 002251 | | JMP | @RETN4 | ;YES-RETURN TO PC |
| 01345 | 070464 | | DIA | 2,64 | ;NO - GET DETECTOR B |
| 01346 | 133434 | | ANDZ | 1,2,SZR # | ;DETECTOR B SCANNING ? |
| 01347 | 002251 | | JMP | @RETN4 | ;YES-RETURN TO PC |
| 01350 | 012250 | | ISZ | @SAVE4 | ;INCREMENT RETURN ADDRESS |
| 01351 | 002251 | | JMP | @RETN4 | ;NO-RETURN TO PC+1 |

;SUBROUTINE CLEAR

| 01352 | 041000 | CLEAR: | STA | 0,0,2 | ;CLEAR A WORD |
| 01353 | 146415 | | SUB | 2,1,SNR # | ;WAS LAST WORD CLEARED ? |
| 01354 | 001400 | | JMP | 0,3 | ;YES - RETURN TO PROGRAM |

| STATEMENT NO. IN OCTAL | MACHINE LANGUAGE | INPUT CARD | | | |
|---|---|---|---|---|---|
| 01355 | 151400 | | INC | 2,2 | ;NO-BUMP POINTER |
| 01356 | 000724 | | JMP | CLEAR | ;DO NEXT WORD |
| | | | | | |
| | | | | | ;SUBROUTINE RETURN |
| 01357 | 012240 | RETX: | ISZ | @SAVE | ;INCREMENT RETURN ADDRESS |
| 01360 | 002241 | | JMP | @RETN | ;RETURN |
| | | | | | |
| | | | | | ;SUBROUTINE DREAD (DATA READ) - LEVEL 0 |
| | | | | | |
| | | | | | ;SIGN EXTEND DATA ACO FOR DOUBLE PRECISION |
| 01361 | 171400 | DREAD: | INC | 3,2 | ;INCREMENT RETURN ADDRESS SO SKIP VARIABLE LIST |
| 01362 | 052240 | | STA | 2,@SAVE | ;SAVE RETURN ADDRESS |
| 01363 | 030157 | | LDA | 2,MSK03 | ;GET SAGN BIT MASK (BIT 6) |
| 01364 | 126440 | | SUBO | 1,1 | ;CLEAR HIGH WORD & CARRY |
| 01365 | 113404 | | AND | 0,2,SZR | ;IS DATA POSITIVE OR NEGATIVE ? |
| 01366 | 100040 | | COMO | 0,0 | ;NEGATIVE -INVERT ALL BITS & SET CARRY |
| 01367 | 030160 | | LDA | 2,MSK04 | ;POSITIVE - GET SIGN EXTEND MASK |
| 01370 | 143403 | | AND | 2,0,SNC | ;SIGN EXTEND LOW WORD BY CLEARING BITS 1 THRU 5 |
| | | | | | ;WAS DATA NEGATIVE ? |
| 01371 | 000403 | | JMP | DPADD | ;NO, GO TO DOUBLE PRECISION ADD |
| 01372 | 100000 | | COM | 0,0 | ;YES-COMPLEMENT LOW WORD |
| 01373 | 124000 | | COM | 1,1 | ;COMPLEMENT HIGH WORD |
| | | | | | |
| | | | | | ;ADD DATA (AC1 & AC0) TO CURRENT SUM |
| 01374 | 035400 | DPADD: | LDA | 3,0,3 | ;GET LOC OF LOC OF VARIABLE LIST |
| 01375 | 033402 | | LDA | 2,2,3 | ;GET LOW WORD OF SUM |
| 01376 | 143020 | | ADDZ | 2,0 | ;ADD LOW WORDS, RESULT IN AC0 |
| 01377 | 033401 | | LDA | 2,1,3 | ;GET HIGH WORD |
| 01400 | 151002 | | MOV | 2,2,SZC | ;WAS CARRY FROM LOW WORD ADD = 1? |
| 01401 | 151400 | | INC | 2,2 | ;YES-ADD CARRY TO HIGH WORD |
| 01402 | 147000 | | ADD | 2,1 | ;ADD HIGH WORDS |
| 01403 | 017404 | | DSZ | 4,3 | ;DECREMENT CONVERSION COUNTER- IS IT |

| STATEMENT NO. IN OCTAL | MACHINE LANGUAGE | INPUT CARD | | | Comment |
|---|---|---|---|---|---|
| 01404 | 000427 | | JMP | STORE | ;ZERO YET (HAS 512 CONVERSIONS BEEN READ) ? |
| 01405 | 125220 | | MOVZR | 1,1 | ;DIVDE SUM BY 512 IN FASTEST POSSIBLE WAY |
| 01406 | 101200 | | MOVR | 0,0 | ;SHIFT HIGH WORD ONE BIT |
| 01407 | 101300 | | MOVS | 0,0 | ;SHIFT LOW WORD ONE BIT |
| 01410 | 111100 | | MOVL | 0,2 | ;SWAP HI & LOW BYTES OF LOW WORD |
| 01411 | 030165 | | LDA | 2,MSK09 | ;MAKE CARRY = 1 IF RESULT SHOULD BE ROUNDED UP |
| 01412 | 143400 | | AND | 2,0 | ;GET BYTE MASK |
| 01413 | 147400 | | AND | 2,1 | ;CLEAR HIGH BYTE OF LOW WORD |
| 01414 | 125300 | | MOVS | 1,1 | ;CLEAR HIGH BYTE OF HIGH WORD |
| 01415 | 123002 | | ADD | 1,0,SZC | ;SWAP HIGH & LOW BYTES OF HIGH WORD |
| 01416 | 101400 | | INC | 0,0 | ;FORM RESULT, SHOULD IT BE ROUNDED UP ? |
| | | | | | ;YES ROUND IT UP |
| 01417 | 013400 | | ISZ | 0,3 | ;STORE CURRENT SAMPLE ACO IN TABLE |
| | | | | | ;BUMP SAMPLE COUNTER |
| 01420 | 027400 | | LDA | 1,0,3 | ;GET SAMPLE CTR |
| 01421 | 031776 | | LDA | 2,M2,3 | ;GET FIRST LOC OF DATA TABLE (DATAA OR DATAB) |
| 01422 | 133020 | | ADDZ | 1,2 | ;MAKE DATA TABLE POINTER-SKIP FIRST LOC |
| 01423 | 041000 | | STA | 0,0,2 | ;STORE SAMPLE IN DATA TABLE |
| 01424 | 030121 | | LDA | 2,CONO3 | ;GET MAX # SAMPLES |
| 01425 | 132425 | | SUBZ | 1,2,SNR | ;SCAN ERROR ? |
| 01426 | 000410 | | JMP | SCNE | ;YES |
| 01427 | 020117 | | LDA | 0,CONO1 | ;NO-GET CONSTANT = 512 DECIMAL |
| 01430 | 043404 | | STA | 0,4,3 | ;SET CONVERSION COUNTER = 512 DECIMAL |
| 01431 | 126400 | | SUB | 1,1 | ;CLEAR AC1 (HIGH WORD) |
| 01432 | 102400 | STORE: | SUB | 0,0 | ;CLEAR ACO (LOW WORD) |
| 01433 | 043402 | | STA | 0,2,3 | ;STORE LOW WORD |
| 01434 | 047401 | | STA | 1,1,3 | ;STORE HIGH WORD |
| 01435 | 002291 | | JMP | @RETN | ;RETURN TO MAIN PROGRAM AFTER LOC OF VAR. LIST |
| 01436 | 006210 | SCNE : | JSR | @RRLT | ;READ & PRINT REAL TIME |
| 01437 | 020164 | | LDA | 0,MSKU8 | ;GET SCAN ERROR OUTPUT MASK |
| 01440 | 061073 | | DOA | 0,73 | ;OUTPUT SCAN ERROR TO SENSOR A INTERFACE |
| 01441 | 061063 | | DOA | 0,63 | ;OUTPUT SCAN ERROR TO SENSOR B INTERFACE |
| 01442 | 006211 | | JSR | @.TEXT | ;PRINT A CR,LF,750H,6. 'SCAN-' |
| 01443 | 027723 | | TXTO3 | | ;INDIRECT ADDRESS OF MESSAGE |
| 01444 | 006212 | | JSR | @.TEX1 | ;PRINT 'ERROR ' |
| 01445 | 002717 | | TXTO2 | | ;INDIRECT ADDRESS OF MESSAGE |
| 01446 | 000377 | | JMP | DIAG | ;JUMP TO DIAGNOSTICS |

| STATEMENT NO. IN OCTAL | MACHINE LANGUAGE | INPUT CARD | | | |
|---|---|---|---|---|---|
| 01564 | 024163 | DEDMN: | LDA | 1,MSK07 | ;GET DEADMAN MASK |
| 01565 | 065052 | | DOA | 1,52 | ;OUTPUT S1 |
| 01566 | 124000 | | COM | 1,1 | ;COMPLEMENT DEADMAN MASK |
| 01567 | 065025 | | DOA | 1,25 | ;OUTPUT S2 |
| 01570 | 001400 | | JMP | 0,3 | ;RETURN TO PROGRAM |

We claim as our invention:

1. Apparatus for electrically communicating information embodied in an analog signal generated at a first location to a remote second location, which maximizes noise rejection including:

an analog to digital converter situated at the first location and operable to sample the analog signal with a periodicity equal to an integral number of cycles of the power line to provide an electrical digital output representative of the samples taken;

means for transmitting the digital output to the second remote location;

a summing unit electrically responsive to the digital output at the second remote location to maintain a running digital sum of the samples taken and responsive to a reset input to transmit the digital sum and clear the sum from the unit;

means for digitally shifting the transmitted sum and dropping the least significant bit;

a random access memory responsive to the transmitted sum to store all but the least significant bits of the sum that were dropped in a corresponding memory location;

a first counter operable to cycle through its respective output states with the same periodicity as that of the samples taken;

a decoder responsive to a given output state of the first counter to provide an output which is communicated to the reset input of the summing unit and a strobe input on the random access memory which readies the random access memory to accept the transmitted sum; and a second counter responsive to the respective decoder outputs to cycle through its corresponding output states which are communicated to the random access memory to identify the location within the random access memory the transmitted sum is to assume.

* * * * *